(12) United States Patent
Argon

(10) Patent No.: US 7,415,651 B2
(45) Date of Patent: Aug. 19, 2008

(54) DATA COMMUNICATION SYSTEM WITH MULTI-DIMENSIONAL ERROR-CORRECTION PRODUCT CODES

(75) Inventor: Cenk Argon, Madison, WI (US)

(73) Assignee: Seagate Technology, Scotts Valley, CA (US)

( * ) Notice: Subject to any disclaimer, the term of this patent is extended or adjusted under 35 U.S.C. 154(b) by 663 days.

(21) Appl. No.: 10/859,375

(22) Filed: Jun. 2, 2004

(65) Prior Publication Data

US 2005/0273688 A1 Dec. 8, 2005

(51) Int. Cl.
*H03M 13/00* (2006.01)

(52) U.S. Cl. .................................................. 714/755
(58) Field of Classification Search ................ 714/755, 714/804
See application file for complete search history.

(56) References Cited

U.S. PATENT DOCUMENTS

| | | | | |
|---|---|---|---|---|
| 4,665,537 | A * | 5/1987 | Moriyama | 714/755 |
| 4,670,881 | A * | 6/1987 | Imoto | 714/755 |
| 4,682,333 | A * | 7/1987 | Onishi et al. | 714/755 |
| 4,731,799 | A * | 3/1988 | Longstaff et al. | 375/261 |
| 5,321,703 | A * | 6/1994 | Weng | 714/797 |
| 5,563,897 | A | 10/1996 | Pyndiah et al. | |
| 5,708,667 | A * | 1/1998 | Hayashi | 714/755 |
| 5,859,859 | A | 1/1999 | Kim | |
| 6,526,538 | B1 | 2/2003 | Hewitt | |
| 6,581,178 | B1 * | 6/2003 | Kondo | 714/758 |
| 6,606,725 | B1 | 8/2003 | Wang et al. | |
| 6,628,723 | B1 * | 9/2003 | Gerlach et al. | 375/259 |
| 6,802,037 | B2 * | 10/2004 | Kim et al. | 714/755 |
| 7,100,101 | B1 * | 8/2006 | Hemphill et al. | 714/755 |
| 7,127,658 | B2 * | 10/2006 | Cucchi et al. | 714/755 |
| 2001/0016931 | A1 * | 8/2001 | Mottier et al. | 714/790 |
| 2001/0050622 | A1 * | 12/2001 | Hewitt et al. | 341/50 |
| 2002/0010892 | A1 * | 1/2002 | Lodge et al. | 714/777 |
| 2002/0026615 | A1 | 2/2002 | Hewitt et al. | |
| 2002/0083391 | A1 * | 6/2002 | Huggett et al. | 714/777 |
| 2002/0174403 | A1 * | 11/2002 | Chethik | 714/804 |

(Continued)

FOREIGN PATENT DOCUMENTS

DE 10147482 * 1/2003

(Continued)

OTHER PUBLICATIONS

Lodge et al.; Separable MAP "filters" for the decoding of product and concatenated codes; Communications, 1993. ICC 93. Geneva. Technical Program, Conference Record, IEEE International Conference on; vol. 3, May 23-26, 1993 pp. 1740-1745.*

(Continued)

*Primary Examiner*—Jacques Louis-Jacques
*Assistant Examiner*—Sam Rizk
(74) *Attorney, Agent, or Firm*—Cesari and McKenna, LLP

(57) ABSTRACT

A data communication system has a combiner circuit that combines a set of information symbols with error correction codes and that generates a set of product codes that are at least three dimensional. A communication channel receives the set of product codes and provides the set of product codes with errors after a channel delay. A channel detector receives the set of product codes with the errors and generates a channel detector output. An error correction circuit receives the channel detector output and iteratively removes the errors to provide a set of reproduced information symbols with a reduced number of the errors.

27 Claims, 7 Drawing Sheets

U.S. PATENT DOCUMENTS

| | | |
|---|---|---|
| 2003/0033570 A1 | 2/2003 | Khannanov et al. |
| 2003/0043487 A1 | 3/2003 | Morita et al. |
| 2003/0056166 A1* | 3/2003 | Kim et al. .................. 714/755 |
| 2003/0066020 A1 | 4/2003 | Morita et al. |
| 2003/0093740 A1* | 5/2003 | Stojanovic ................. 714/752 |
| 2003/0093741 A1 | 5/2003 | Argon et al. |
| 2003/0106012 A1 | 6/2003 | Hewitt |
| 2004/0019842 A1 | 1/2004 | Argon et al. |
| 2004/0117711 A1* | 6/2004 | Farbert et al. ............... 714/755 |
| 2005/0149819 A1* | 7/2005 | Hwang ....................... 714/758 |
| 2006/0190271 A1* | 8/2006 | Kim et al. ..................... 705/1 |

OTHER PUBLICATIONS

Barbulescu et al.; Interleaver Design for Three Dimensional Turbo Codes; IEEE International Symposium on Information Theory, 1995, p. 37.*

Freeman et al.; A Two-Dimensional Product Code with Robust Soft-Decision Decoding; IEEE Transactions on Communications, vol. 44, No. 10, Oct. 1996; pp. 1222-1226.*

* cited by examiner

DATA COMMUNICATION SYSTEM WITH MULTI-DIMENSIONAL ERROR-CORRECTION PRODUCT CODES

FIELD OF THE INVENTION

The present invention relates generally to error correction in communication channels, and more particularly but not by limitation to error correction in data storage devices.

BACKGROUND OF THE INVENTION

With the increasing demand for high data rate communications systems, there is an need for improved error detection and correction. In this area of technology, iterative error-correction codes (ECC) such as convolutional turbo codes (CTC), low-density parity-check (LDPC) codes, and turbo product codes (TPC) are being considered for various communication applications. The main advantage of these types of codes is that they enable very low bit-error rates (BER) for storage devices or communication links at low signal-to-noise ratios (SNR). However, as density and speed increases, higher error rates are encountered that are difficult to lower in real time using these techniques.

Embodiments of the present invention provide solutions to these and other problems, and offer other advantages over the prior art.

SUMMARY OF THE INVENTION

Disclosed are a method and data communication system that reduce errors. The data communication system comprises a combiner circuit that combines a set of information symbols with error correction codes. The combiner circuit generates a set of product codes that are at least three dimensional.

The data communication system comprises a communication channel that receives the set of product codes. The communication channel provides the set of product codes with errors after a channel delay. A channel detector receives the set of product codes with the errors and generates a channel detector output.

The data communication system comprises an error correction circuit that receives the channel detector output. The error correction circuit iteratively removes the errors to provide a set of reproduced information symbols with a reduced number of the errors.

Other features and benefits that characterize embodiments of the present invention will be apparent upon reading the following detailed description and review of the associated drawings.

DETAILED DESCRIPTION OF ILLUSTRATIVE EMBODIMENTS

In the embodiments described below, a data communication system (such as a disc drive) includes a combiner circuit that combines a set of information symbols (user data) with error correction codes and that generates a set of product codes that are at least three dimensional. The use of three dimensional (or higher) product codes greatly enhances the ability to correct larger numbers of errors in a set of information symbols. A communication channel (such as a disc read/write system) receives the set of product codes and provides the set of product codes with errors after a channel delay. The errors are generated by imperfect read or write operations. During long variable delays between writing and reading information, the original information is deleted from the host system and can't be retransmitted to the communication channel. A channel detector receives the set of product codes with the errors and generates a channel detector output. An error correction circuit receives the channel detector output and iteratively removes the errors to provide a set of reproduced information symbols with a reduced number of the errors. The embodiments described correct errors in spite of the long channel delay and noisiness of the channel.

Figure 1:
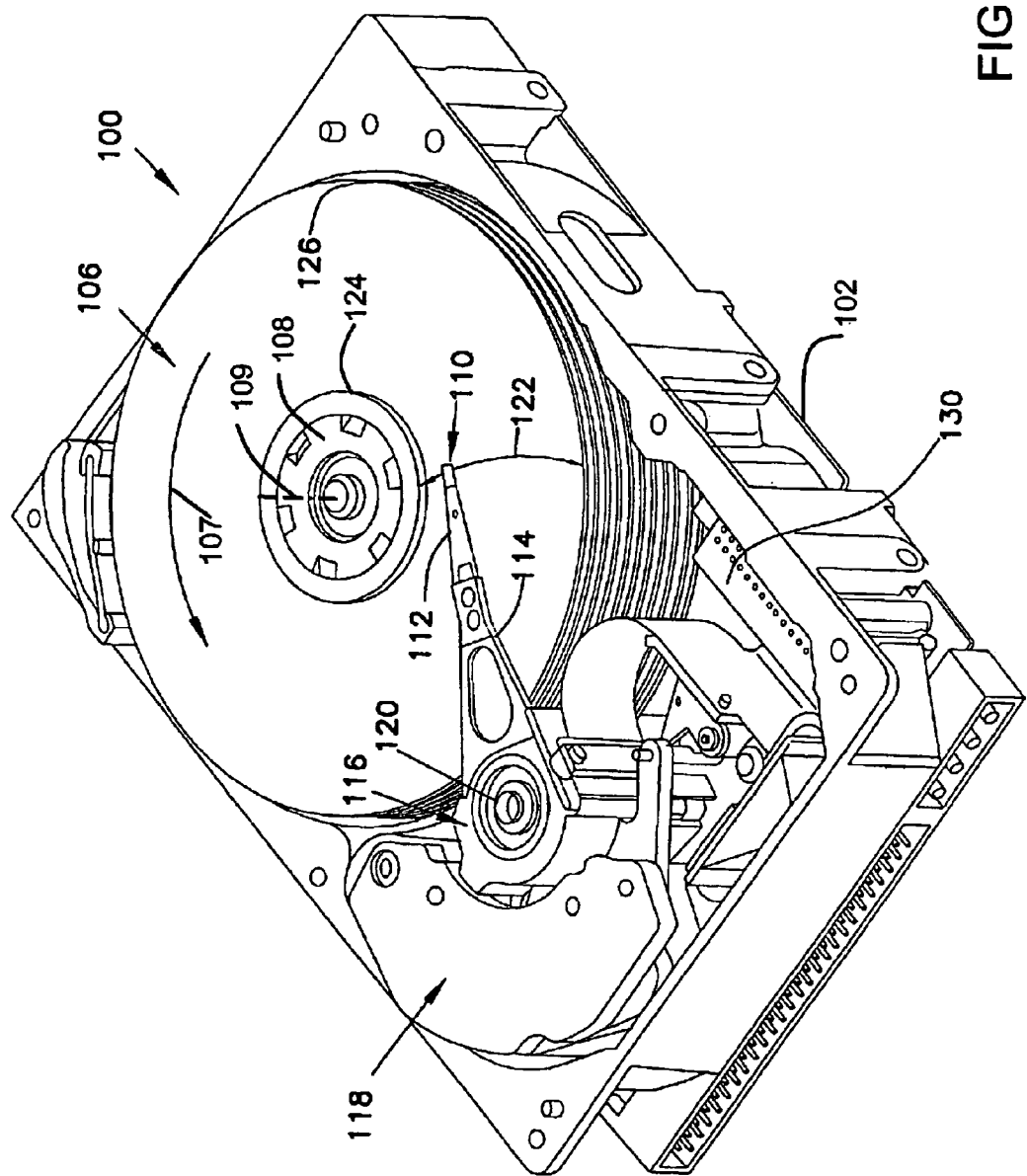
FIG. 1 illustrates an oblique view of a disc drive.
Figure 2:
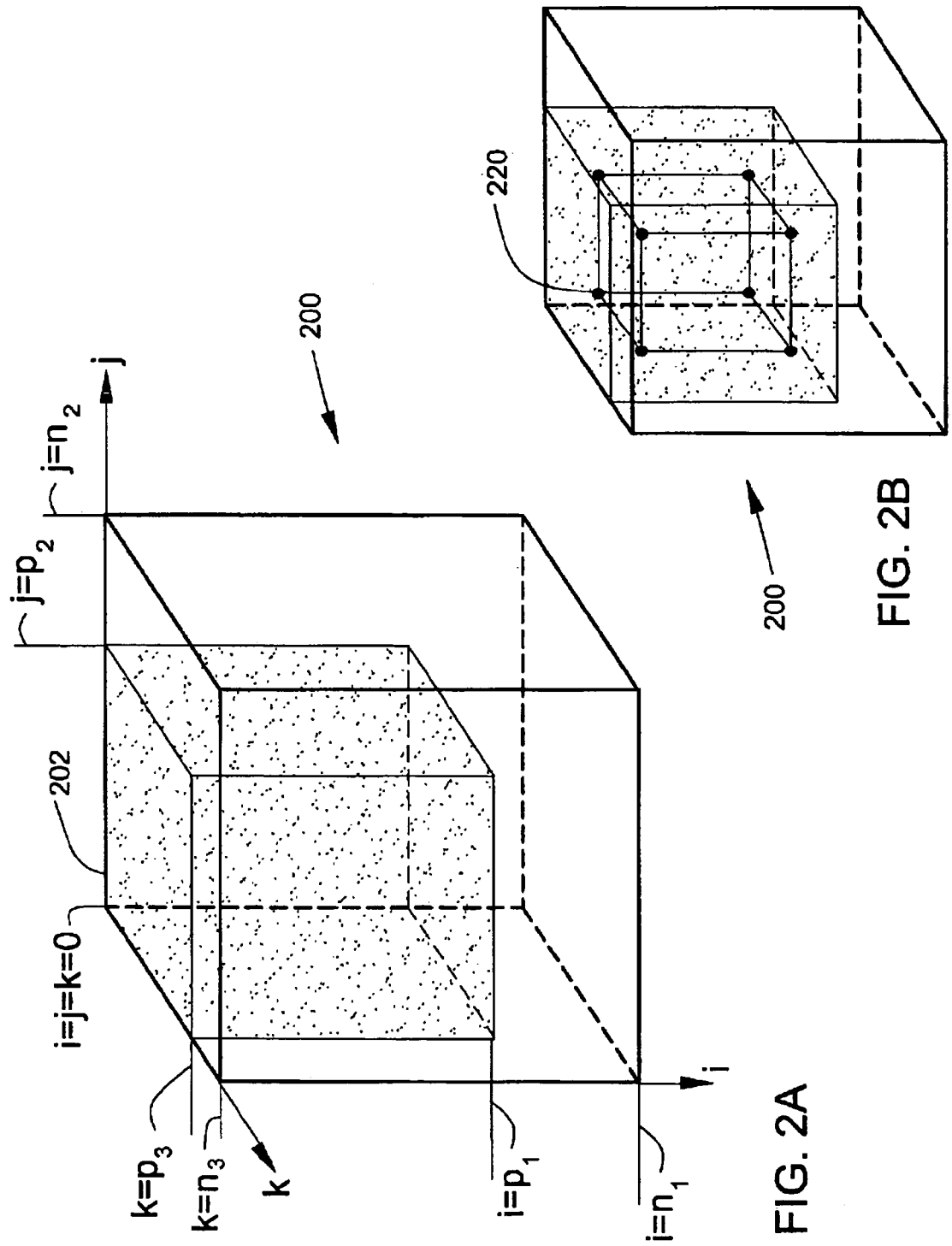
FIG. 2A illustrates a three dimensional set of product codes.
FIG. 2B illustrates a pattern of errors in a set of product codes that is not correctable by three dimensional error correction.

FIG. 1 is an oblique view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109 in a direction indicated by arrow 107. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

The disc drive 100 is an example of a communication channel that receives sets of symbols (data blocks to be written) and then reproduces the sets of symbols (reads the data block) after a time delay T. The communication channel is noisy, and the reproduced sets of symbols can have errors. Further, the time delay T between writing and reading a particular set of symbols is typically so long that the host computer no longer retains the original set of symbols. The original set of symbols is thus not available to retransmit through the communication channel. To overcome this problem, a set of product codes with three or more dimensions are provided, and the product codes are used to correct errors introduced by the noisy channel. Examples of error corrections that are applicable to disc drives and other noisy communication channels with delays are described below in connection with FIGS. 2-8.

FIG. 2A illustrates an oblique view of a three dimensional product code set (set of product codes) 200. The product code set 200 is illustrated as a rectangular prism that represents a three (3) dimensional array of bits (not individually illustrated) that make up the product code set 200. The rectangular prism representing the product code set 200 has dimensions in bits along three mutually perpendicular axes designated as i, j and k. The dimensions of the product code set are $i=n_1$, $j=n_2$, $k=n_3$ as illustrated. In a preferred arrangement, $n_1=n_2=n_3$ and the product code set 200 is represented by a cube. The product code set 200 represents a block of data of a standard size that can be conveniently handled as a data object by the communication channel. In the case of a disc drive, for example, the block of data (data object) typically comprises a data sector such as 4,096 bits (512 eight-bit bytes) with $n_1=n_2=n_3=16$ bits. Other data sector sizes can also be used.

The product code set 200 includes a symbol set (set of symbols) 202 that is indicated by a stippled rectangular prism within the product code set 200. This set of symbols 202 is typically data provided by a host system to a data communication system. The remaining portions of the product code set 200 (those not included in the symbol set 202) comprise bits used for error correction.

The error correction codes in all three dimensions are bit-wise error correction codes. As shown in FIG. 2A, the set of symbols 202 occupy a rectangular space with dimensions $p_1$, $p_2$, $p_3$. The product code set 200 occupies a rectangular space with dimensions $n_1$, $n_2$, $n_3$.

While the graphical representation in FIG. 2A represents a three (3) dimensional product code set 200, it will be understood that product code sets with more than three dimensions can also be used.

FIG. 2B illustrates a pattern of eight errors 220 in a set of product codes 200 that is not correctable by three dimensional error correction using product codes that are constructed with single parity check codes. Each of the eight errors 220 is represented in FIG. 2B by a dot at one corner of a rectangular prism. Each of the errors 220 is three dimensionally aligned with three other errors, and thus three dimensional error correction methods with single parity check component codes are generally not able to correct such an arrangement of eight aligned errors, even through the use of iterative techniques. Three dimensional error corrections with single parity check component codes are, however, capable of correcting larger numbers of errors that are not aligned as shown in FIG. 2B. If any one of the eight errors shown in FIG. 2B is not present, then the three dimensional error correcting technique is capable of iteratively correcting seven errors even when the errors are dimensionally aligned with one another in a pattern similar to that shown in FIG. 2B. The three dimensional error correction technique is thus capable of correcting all but a few error patterns that occur.

Figure 3:
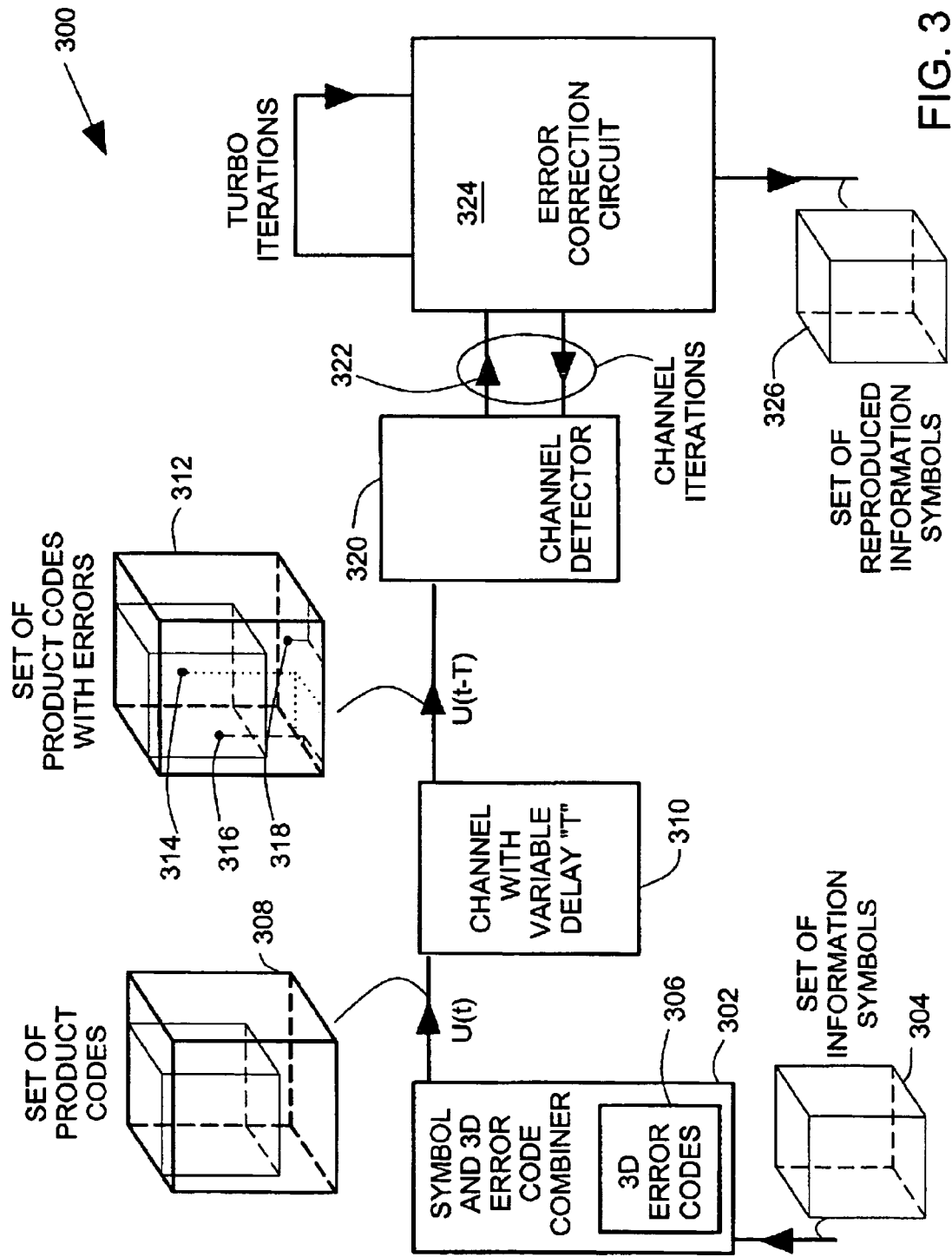
FIG. 3 illustrates a block diagram of a first embodiment of a data communication system.

FIG. 3 illustrates a block diagram of a first embodiment of a data communication system 300. The data communication system 300 comprises a combiner circuit 302. The combiner circuit 302 combines a set of information symbols 304 with error correction codes 306 to generate a set of product codes 308 that are at least three dimensional as explained above in an example illustrated in FIG. 2A.

The data communication system 300 also comprises a communication channel 310. The communication channel 310 receives the set of product codes 308 as a signal U(t) and provides the a set 312 of product codes with errors as a signal U(t-T) after a channel delay T. The communication channel 310 is a noisy communication channel that introduces one or more errors into the product code set with errors 312. The errors are in bits represented by dots 314, 316, 318. There is a delay T associated with the communication channel 310 producing the product code set with errors 312. By the time that the communication channel 310 generates the product code set with errors 312, the original information symbol set 304 is typically no longer present in the host system.

The data communication system 300 comprises a channel detector 320 that receives the set of product codes with the errors 312 and that generates a channel detector output 322. An error correction circuit 324 receives the channel detector output 322. The error correction circuit 324 iteratively removes the errors to provide a set of reproduced information symbols 326 with a reduced number of errors.

In a preferred arrangement, the set of product codes 308 comprise turbo product codes. The set of information symbols 304 is preferably un-encoded. The set of product codes 308 provide distance (such as Hamming distance) between individual information symbols (such as bits or bytes) in the set of information symbols 304.

In a preferred arrangement, the error correction circuit 324 corrects errors using a psi function as described in more detail below in connection with an example illustrated in FIG. 6. The psi ($\Psi$) function is preferably of the form:

$$\Psi(x) = \log\left[\frac{e^x + 1}{e^x - 1}\right]. \qquad \text{Equation 1}$$

The term "e" is the base of natural logarithms (2.718 . . . ) and the term "x" is an independent variable. The error correction codes can comprise single parity check codes, checksum codes or other well-known error checking codes. The channel delay T can be variable without interfering with the error correcting performed in the error correction circuit 324. The channel delay T can be longer than a transmission time of the set of product codes 308 without interfering with the error correcting performed in the error correction circuit 324.

In another preferred arrangement, the channel detector 320 comprises a viterbi detector that couples the set of product codes with errors 312 to the error detection circuit 324.

Figure 4:
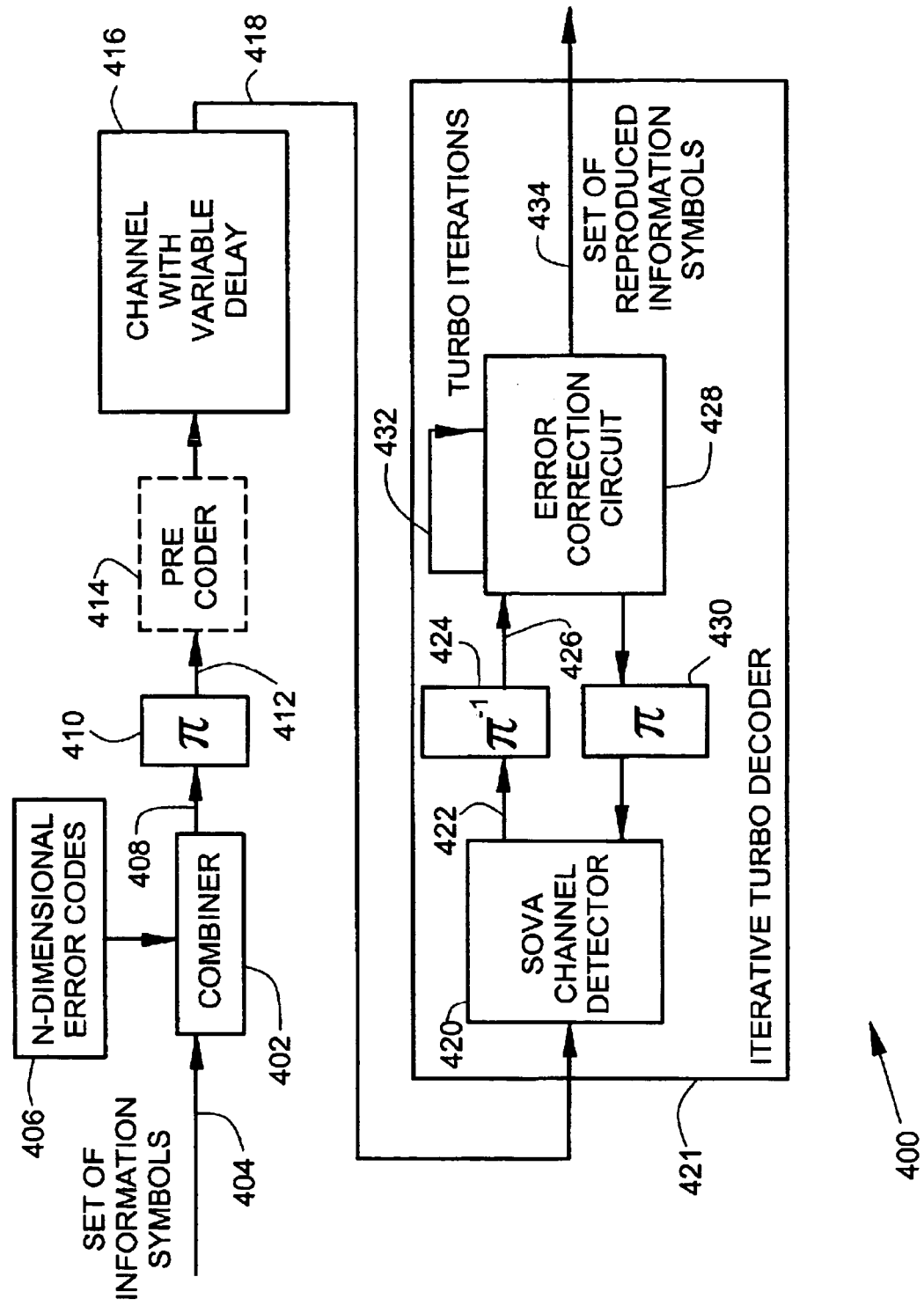
FIG. 4 illustrates a block diagram of a second embodiment of a data communication system.

FIG. 4 illustrates a block diagram of a second embodiment of a data communication system 400. The data communication system 400 comprises a combiner 402. The combiner 402 combines a set of information symbols 404 with N-dimensional error codes 406 to produce an N-dimensional product code 408, where N is at least three (3). The product code at 408 is provided to an interleaver ($\pi$) 410. The interleave 410 reorders bits of the received product code 408 to produce a reordered interleaver output 412. Successive bits in the product code 408 are reordered to separate successive bits and provide distance between the successive bits at the interleaver output 412. This interleaver arrangement randomizes bursts of noise and enhances the ability to perform error correction. The interleaver output 412 comprises a interleaved set of product codes for coupling to a communication channel 416.

In a preferred arrangement, the interleaver output is passed through a pre-coder 414 before being passed on to the communication channel 416. The communication channel 416 is noisy and also has a long, variable delay as described above in connection with communication channel 320 in FIG. 3.

The communication channel 416 provides a communication channel output (with errors) on line 418 that is applied to a soft output viterbi algorithm (SOVA) detector 420 that is part of an iterative turbo decoder 421. The SOVA detector provides a SOVA detector output 422 to a de-interleaver 424. The de-interleaver 424 initially provides a de-interleaved set of product codes with errors on line 426 to an error correction circuit 428. The error correction circuit 428 feeds corrected data back through interleaver 430 to the SOVA channel detector 420. The operation of the error detection circuit 428 is iterative and loops through turbo iterations 432 until an optimum number of correctable errors are corrected. This looping process is described in more detail below in an example illustrated in FIG. 6. The error correction circuit 428 reproduces a set of information symbols 434 with a reduced number of errors.

Figure 5:
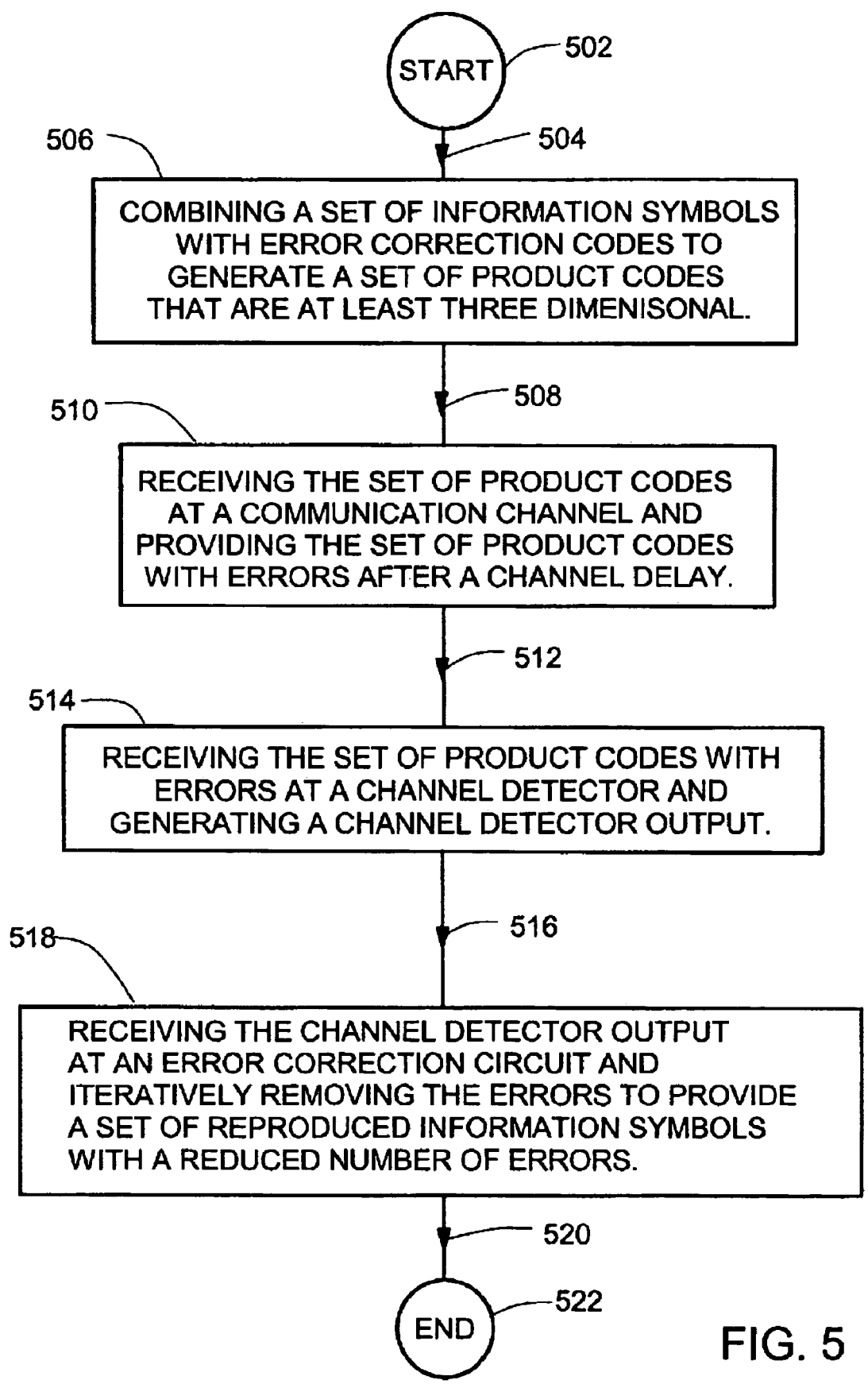
FIG. 5 illustrates a method of passing a set of information symbols through a communication system.

FIG. 5 illustrates a method of passing a set of information symbols through a data communication channel. The method begins at START 502 and continues along line 504 to action block 506. At action block 506, a set of information symbols is combined with error correction codes to generate a set of product codes that are at least three dimensional.

After completion of action block 506, the method continues along line 508 to action block 510. At action block 510, the set of product codes is received in the communication channel, and then the communication channel provides a set of product codes with errors after a channel delay.

After completion of action block 510, the method continues along line 512 to action block 514. At action block 514, the set of product codes with the errors is received at a channel detector, the channel detector generates a channel detector output.

After completion of action block 514, the method continues along line 516 to action block 518. At action block 518, an error correction circuit receives the channel detector output, and the error correction circuit iteratively removes the errors to provide a set of reproduced information symbols with a reduced number of the errors.

After completion of action block 518, the method continues along line 520 to END 522. At end 522, the method is ready to return to start 502 to apply the method to pass a subsequent set of information symbols through the communication channel.

Using the set of product codes preferably provide distance between information symbols in the set of information symbols. The channel delay can vary to a time longer than a transmission time of the set of product codes, without adversely affecting the error correction method.

In a preferred arrangement, a psi function is used in the error correction circuit to correct the errors as described in more detail below in an example shown in FIG. 6.

Figure 6:
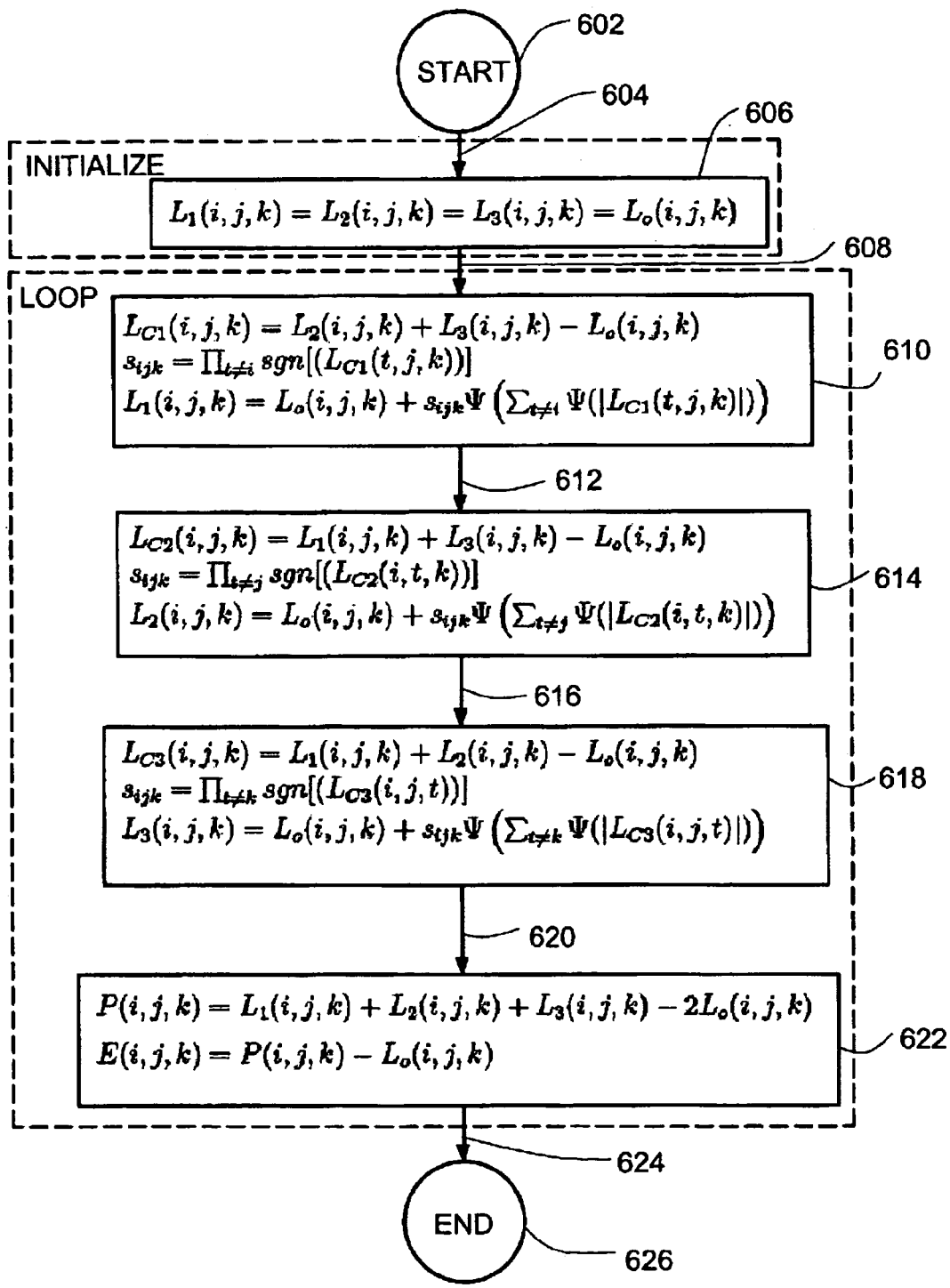
FIG. 6 illustrates a process of error correction using turbo product codes.

FIG. 6 illustrates a process of error correction using a three dimensional turbo product code constructed via single parity check component codes. Referring back to FIG. 4, a de-interleaver 424 provides a de-interleaved set of product codes. The reliability information for this de-interleaved set of product codes is $L_0$ (i,j,k) where i, j, k are the indices of a three dimensional block of product codes with errors such as the one illustrated in FIG. 2B. The method in FIG. 6 begins at START 602 and continues along line 604 to action block 606 that provides initialization. At action block 606, the reliability information $L_1$, $L_2$, $L_3$ are all set to $L_0$. After completion of action block 606, the method continues along line 608 to action block 610 which begins a main loop part of the method.

At action block 610, reliability information $L_1$ is updated in an iteration. After completion of action block 610, the method continues along line 612 to action block 614. At action block 614, reliability information $L_2$ is updated. After completion of action block 614, the method continues along line 616 to action block 618. At action block 618, reliability information $L_3$ is updated. After completion of action block 618, the method continues along line 620 to action block 622.

At action block 622, bit decisions are made based on the sign of P(i,j,k) and extrinsic information E(i,j,k) is passed back to the channel detector (such as channel detector 420 in FIG. 4) by way of an interleaver (such as interleaver 430 in FIG. 4).

Figure 7:
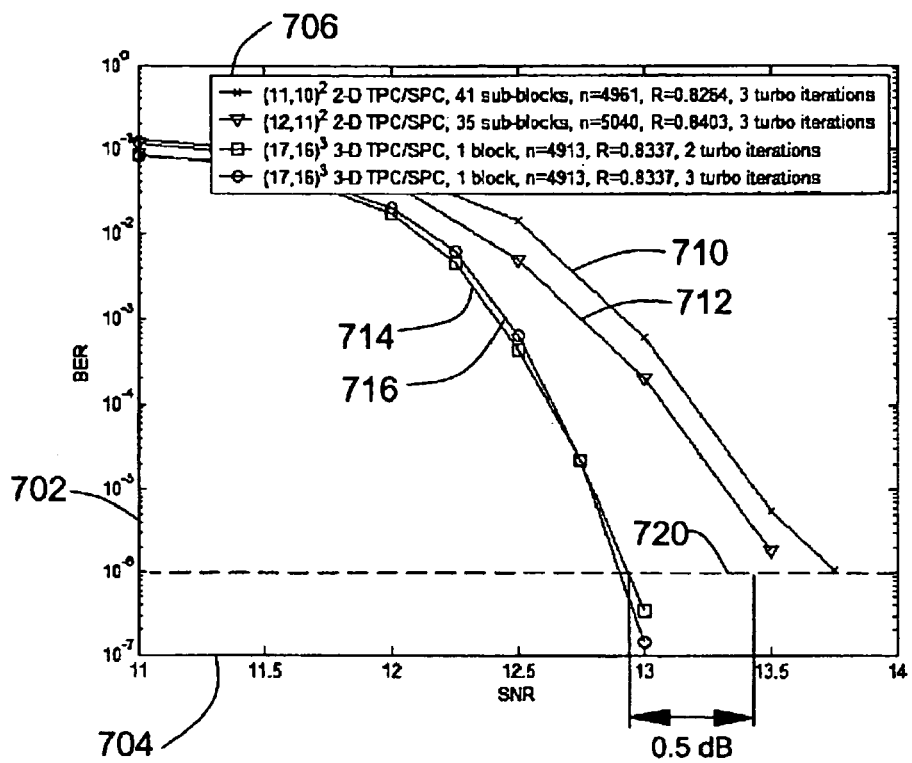
FIG. 7 illustrates a graph of bit error rates as a function of signal-to-noise ratio for two dimensional error correction.

FIG. 7 illustrates a graph of bit error rates as a function of signal-to-noise ratio for two and three dimensional error correction. FIG. 7 has a logarithmic vertical axis 702 that represents bit error rate, and a horizontal axis 704 that represents signal-to-noise ratio. A key 706 identifies four different simulation conditions. In FIG. 7, the code rate R is about 0.83 and the codeword size "n" is about 5000 bits. In FIG. 7, traces 710, 712 show bit error rates for two-dimensional turbo product codes with single parity check, and traces 714, 716 shown bit error rates for three dimensional turbo product codes with single parity check. With the three dimensional turbo product codes of traces 714, 716, there is an advantage of lower bit error rates when compared to the two dimensional turbo product codes of traces 710, 712. At BER=$10^{-6}$ (line 720), about 0.5 dB gain in SNR is observed when comparing the 3-D TPC performance with the 2-D TPC performance.

Figure 8:
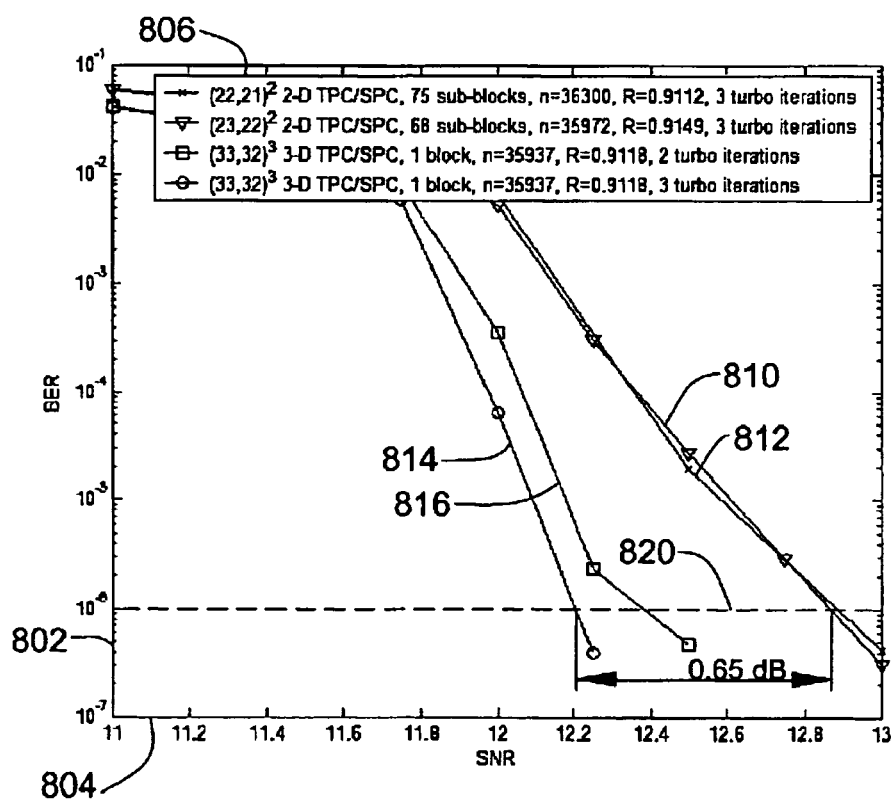
FIG. 8 illustrates a graph of bit error rates as a function of signal-to-noise ratio for three dimensional error correction.

FIG. 8 illustrates a graph of bit error rates as a function of signal-to-noise ratio for two and three dimensional error correction. FIG. 8 has a logarithmic vertical axis 802 that represents bit error rate, and a horizontal axis 804 that represents signal-to-noise ratio. A key 806 identifies four different simulation conditions. In FIG. 8, the code rate R is about 0.91 and the codeword size is about 36,000 bits. In FIG. 8, traces 810, 812 show bit error rates for two-dimensional turbo product codes with single parity check, and traces 814, 816 shown bit error rates for three dimensional turbo product codes with single parity check. With the three dimensional turbo product codes of traces 814, 816, there is an advantage of lower bit error rates when compared to the two dimensional turbo product codes of traces 810, 812. In FIG. 8, the 3-D TPC/SPC performed about 0.65 dB better when compared to 2-D TPC/SPC's at BER=$10^{-6}$ (line 820). The number of turbo iterations affected the performance significantly for the 3-D TPC/SPC when increased from two to three.

For both FIGS. 7-8, the number of channel iterations was set to three. The number of turbo iterations was set to three for the 2-D case, whereas for the 3-D cases both two and three turbo iterations were simulated.

In the keys 706, 806, $(m,m-1)^2$ 2-D TPC/SPC denotes a two-dimensional TPC formed with (m,m−1) SPC component codes; i.e., (m−1) user bits of a row/column are used to calculate the even parity bit for each row/column. To achieve a larger block size, the 2-D product codewords are arranged in sub-blocks to form one large codeword. Similar to the 2-D case, $(m,m-1)^3$ 3-D TPC/SPC denotes a three-dimensional TPC where all three dimensions are encoded using a (m,m−1) SPC code. No precoding was used for the 3-D case, whereas a $1/(1/D^2)$ precoder was needed for the 2-D case.

For the two dimensional case, iterative decoding within the error correction circuit is performed by applying a loop consisting of row decoding, followed by column decoding, followed by row decoding, etc. A row decoding followed by a column decoding (or vice versa) is called a turbo iteration, whereas the information exchange between the error correction circuit and the channel detector is called channel iteration. For the three dimensional case, the information bits are arranged in a three-dimensional array and encoding is performed on all three dimensions. With a 3-D structure, each information bit is protected by three codes instead of only two, as it is the case with a 2-D structure.

Only a few permanent error patterns can remain with this 3-D structure when the component codes are SPC codes as illustrated in FIG. 2B. In this case, the remaining permanent error patterns are formed by a minimum of eight errors located at the corners of a box-shaped grid as shown in FIG. 2B.

Regarding the iterative decoding process, the message passing algorithm (MPA) is extended to the 3-D case as shown in FIG. 6.

In FIG. 6, the use of a SOVA (Soft-Output Viterbi Algorithm) detector is an example. The channel detector can be implemented using any algorithm providing soft reliability information, such as a MAP (maximum A posteriori) or BCJR (Bahl, Cocke, Jelinek, and Raviv) algorithm. As can be observed from FIG. 6, decoding is performed on all three dimensions. At the final iteration, bit decisions are made based on the sign of P(i,j,k), and extrinsic information E(i,j,k) is passed back to the channel detector. The algorithm described above can be easily extended to dimensions greater than three.

The magnetic recording channel can be modeled as a partial response (PR) channel. Interleavers and de-interleavers are denoted by $\pi$ and $\pi^{-1}$, respectively. Turbo iterations are decoding loops inside the TPC decoder, whereas a channel iteration is defined as information exchange between the TPC decoder and the channel detector. In the example shown in FIG. 4, the channel detector implements the SOVA.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the data communication system while maintaining substantially the same functionality without departing from the scope of the present invention. The arrangements shown can be applied to electronic, optical and magnetic communication channels. In addition, although the preferred embodiment described herein is directed to a data communication system for a disc drive, it will be appreciated by those skilled in the art that the teachings of the present invention can be applied to MRAM and other data communication systems with long delay times, without departing from the scope of the present invention.

What is claimed is:

1. A data communication system, comprising:
    a channel detector configured to receive a set of at-least-three-dimensional product codes from a partial response channel and to generate a channel detector output with reliability information for the product codes; and
    an error correction circuit configured to receive the channel detector output and to:
        i) initialize error correction reliability information for each dimension of respective bits of the product codes to reliability information generated by the channel detector for that bit;
        ii) iteratively update the error correction reliability information for respective dimensions of each bit serially based on error correction reliability information for each other dimension of that bit;
        iii) make bit decisions for each bit of the product code based on the updated error correction reliability information for each dimension of that bit from a final update iteration; and
    in response to errors in the bit decisions after the final update iteration:
        iv) produce extrinsic reliability information for each bit of the bit decisions; and
        v) send the bit decisions and extrinsic reliability information to the channel detector, the channel detector further configured to regenerate the channel detector output with reliability information based on the bit decisions and extrinsic reliability information.

2. The data communication system of claim 1, wherein the channel detector and error correction circuit are configured to perform channel iterations of producing, sending, and regenerating for a configurable number of channel iterations.

3. The data communication system of claim 1, wherein the set of product codes comprise turbo product codes, and wherein the update iterations comprise turbo iterations.

4. The data communication system of claim 1, wherein the set of product codes are four dimensional.

5. The data communication system of claim 1, further comprising:
    a combiner circuit configured to combine a set of information symbols with error correction codes to generate the set of at-least-three-dimensional product codes; and
    a communication channel configured to receive the set of product codes and to provide the set of product codes to the channel detector.

6. The data communication system of claim 1, wherein the final update iteration is based on one of either a configurable number of update iterations or a reliable bit decision.

7. The data communication system of claim 1, wherein the error correction circuit is further configured to iteratively update the error correction reliability information for each dimension of each bit using a psi function.

8. The data communication system of claim 1, wherein the product codes comprise error correction codes.

9. The data communication system of claim 1, wherein the error correction codes comprise at least one of either single parity check codes or checksum codes.

10. The data communication system of claim 1, wherein the channel detector comprises a viterbi detector.

11. The data communication system of claim 1, wherein the channel detector comprises a soft-output viterbi algorithm (SOVA) detector.

12. The data communication system of claim 1, wherein the product code is interleaved, the system further comprising:
    a de-interleaver configured to de-interleave the product code between the channel detector and error correction circuit.

13. The data communication system of claim 1, wherein the product codes at the channel detector are precoded product codes.

14. The data communication system of claim 1, wherein the channel detector is further configured to receive the set of product codes after a channel delay.

15. A method, comprising:
    receiving a set of at-least-three-dimensional product codes from a partial response channel at a channel detector;
    generating a channel detector output with reliability information for the product codes;
    at an error correction circuit:
        i) receiving the channel detector output;

ii) initializing error correction reliability information for each dimension of respective bits of the product codes to reliability information generated by the channel detector for that bit;

iii) iteratively updating the error correction reliability information for respective dimensions of each bit serially based on error correction reliability information for each other dimension of that bit;

iv) making bit decisions for each bit of the product code based on the is updated error correction reliability information for each dimension of that bit from a final update iteration; and in response to errors in the bit decisions after the final update iteration:

at the error correction circuit:

v) producing extrinsic reliability information for each bit of the bit decisions; and vi) sending the bit decisions and extrinsic reliability information to the channel detector; and regenerating, at the channel detector, the channel detector output with reliability information based on the bit decisions and extrinsic reliability information.

16. The method of claim 15, further comprising:
performing channel iterations of producing, sending, and regenerating between the channel detector and the error correction circuit for a configurable number of channel iterations.

17. The method of claim 15, wherein reducing further comprises:
iteratively updating the error correction reliability information for each dimension of each bit using a psi function.

18. An apparatus, comprising:
means for receiving a channel detector output with reliability information for a set of at-least-three-dimensional product codes;
means for initializing error correction reliability information for each dimension of respective bits of the product codes to reliability information within the channel detector output for that bit;
means for iteratively updating the error correction reliability information for respective dimensions of each bit serially based on error correction reliability information for each other dimension of that bit;
means for making bit decisions for each bit of the product code based on the updated error correction reliability information for each dimension of that bit from a final update iteration; and
in response to errors in the bit decisions after the final update iteration:
means for producing extrinsic reliability information for each bit of the bit decisions; and
means for sending the bit decisions and extrinsic reliability information to the channel detector.

19. A data communication system, comprising:
a channel detector configured to generate a channel detector output with reliability information for each bit of a set of at-least-three-dimensional product codes from a partial response channel; and
an error correction circuit configured to receive the channel detector output and to:
i) perform one or more turbo iterations to update the reliability information for respective dimensions of each bit serially based on error correction reliability information for each other dimension of that bit;
ii) return bit decisions and updated reliability information for each bit of the product code from the error correction circuit to the channel detector; and
the channel detector further configured to perform a channel iteration to regenerate the channel detector output with reliability information based on the bit decisions and updated reliability information and to send the regenerated channel detector is output to the error correction circuit.

20. The data communication system of claim 19, wherein the channel detector and error correction circuit are configured to perform a configurable number of channel iterations.

21. The data communication system of claim 19, wherein each turbo iteration is configured to utilize a psi function to update the reliability information for each dimension of each bit.

22. The data communication system of claim 19, wherein the channel detector comprises a viterbi detector.

23. The data communication system of claim 19, wherein the channel detector comprises a soft-output viterbi algorithm (SOVA) detector.

24. The data communication system of claim 19, further comprising:
a de-interleaver configured to de-interleave the product code between the channel detector and error correction circuit; and
an interleaver configured to interleave the product code between the error correction circuit and channel detector; wherein the channel detector is configured to process interleaved product codes, and the error correction circuit is configured to process de-interleaved product codes.

25. A method, comprising:
generating, at a channel detector, a channel detector output with reliability information for each bit of a set of at-least-three-dimensional product codes from a partial response channel;
receiving the channel detector output at an error correction circuit;
performing one or more turbo iterations at the error correction circuit to update the reliability information for respective dimensions of each bit serially based on error correction reliability information for each other dimension of that bit;
returning bit decisions and updated reliability information for each bit of the product code from the error correction circuit to the channel detector; and
performing a channel iteration at the channel detector to regenerate the channel detector output with reliability information based on the bit decisions and updated reliability information and to send the regenerated channel detector output to the error correction circuit.

26. The method of claim 23, further comprising:
performing a configurable number of channel iterations between the channel detector and error correction circuit.

27. The method of claim 25, further comprising:
utilizing a psi function for each turbo iteration to update the reliability information for each dimension of each bit.

* * * * *

UNITED STATES PATENT AND TRADEMARK OFFICE
CERTIFICATE OF CORRECTION

PATENT NO. : 7,415,651 B2 Page 1 of 1
APPLICATION NO. : 10/859375
DATED : August 19, 2008
INVENTOR(S) : Cenk Argon It is certified that error appears in the above-identified patent and that said Letters Patent is hereby corrected as shown below:

Column 9:
Line 10, delete "is"

Column 10:
Line 10, delete "is"

Signed and Sealed this

Fourth Day of November, 2008

JON W. DUDAS
*Director of the United States Patent and Trademark Office*